(12) United States Patent
Chiang et al.

(10) Patent No.: US 9,412,863 B2
(45) Date of Patent: Aug. 9, 2016

(54) ENHANCED BREAKDOWN VOLTAGES FOR HIGH VOLTAGE MOSFETS

(71) Applicant: Taiwan Semiconductor Manufacturing Co., Ltd., Hsin-Chu (TW)

(72) Inventors: Hsin-Chih Chiang, Hsinchu (TW); Tung-Yang Lin, New Taipei (TW); Ruey-Hsin Liu, Hsin-Chu (TW); Ming-Ta Lei, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/580,636

(22) Filed: Dec. 23, 2014

(65) Prior Publication Data

US 2016/0181422 A1    Jun. 23, 2016

(51) Int. Cl.
*H01L 21/8238* (2006.01)
*H01L 29/78* (2006.01)
*H01L 29/66* (2006.01)
*H01L 29/06* (2006.01)
*H01L 29/40* (2006.01)

(52) U.S. Cl.
CPC ........ *H01L 29/7824* (2013.01); *H01L 29/0626* (2013.01); *H01L 29/401* (2013.01); *H01L 29/402* (2013.01); *H01L 29/66681* (2013.01)

(58) Field of Classification Search
CPC ..................... H01L 29/7824; H01L 29/66681; H01L 29/782; H01L 29/7302; H01L 29/66371; H01L 29/1095; H01L 29/66659; H01L 29/735; H01L 29/7835; H01L 29/8605
USPC ................... 438/155, 163, 204; 257/328–339
See application file for complete search history.

(56) References Cited

U.S. PATENT DOCUMENTS

2014/0284701 A1*  9/2014  Korec ................. H01L 29/7824
                                                            257/328

* cited by examiner

*Primary Examiner* — Charles Garber
*Assistant Examiner* — Abdulfattah Mustapha
(74) *Attorney, Agent, or Firm* — Eschweiler & Associates, LLC

(57) ABSTRACT

An integrated circuit (IC) includes a high-voltage (HV) MOSFET on a substrate. The substrate includes a handle substrate region, an insulating region, and a silicon region. Source region and drain regions, which have a first conductivity type, are disposed in the silicon region and spaced apart from one another. A gate electrode is disposed over an upper region of the silicon region and is arranged between the source and drain regions. A body region, which has a second conductivity type, is arranged under the gate electrode and separates the source and drain regions. A lateral drain extension region, which has the first conductivity type, is disposed in the upper region of the silicon region and extends laterally between the body and drain regions. A breakdown voltage enhancing region, which has the second conductivity type, is disposed in the silicon region under the lateral drain extension region.

21 Claims, 7 Drawing Sheets

ENHANCED BREAKDOWN VOLTAGES FOR HIGH VOLTAGE MOSFETS

BACKGROUND

While many portable electronic devices, such as cameras, cell phones, tablets, etc., are designed to operate at low power to maximize the useful battery life of the devices between charges; many other applications, such as automotive ICs, avionics ICs, industrial control ICs, etc., demand higher power to move large loads, transfer power, communicate signals over large distances, etc. Because of this, high voltage (HV) power devices, such as HV metal oxide semiconductor field effect transistors (MOSFETs), are utilized in integrated circuits (ICs) for high-voltage switching and power applications. These HV MOSFETs have structural device features that enable them to withstand high currents and/or high voltages experienced during normal operating conditions.

BRIEF DESCRIPTION OF THE DRAWINGS

Aspects of the present disclosure are best understood from the following detailed descriptions when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
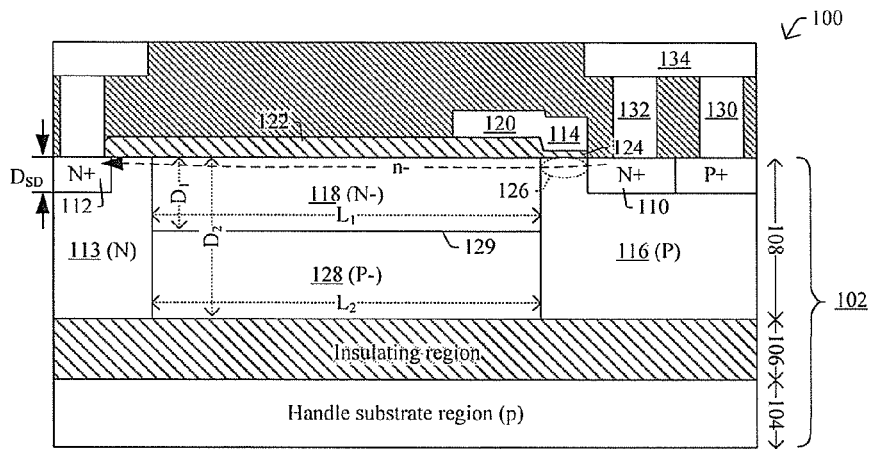
FIG. 1 illustrates a cross-sectional view of an n-type HV MOSFET that includes a breakdown voltage enhancing region in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Further, the described semiconductor devices make use of first and second conductivity types. Depending on the implementation, the first conductivity type can be n-type and the second conductivity type can be p-type, or vice versa. Thus, "first" and "second" are merely generic identifiers in this regard.

Silicon-on-insulator (SOI) substrates are made up of a device substrate, a handle substrate, and an insulating or buried oxide (BOX) layer, which bonds the device substrate to the handle substrate. High voltage power devices, such as HV MOSFETs, are often formed on such SOI substrates because the insulating layer provides isolation to prevent leakage and improve device performance. For a power device formed on an SOI substrate, a breakdown voltage of the power device (i.e., a maximum voltage which the power device can sustain without acting as a conductor, resulting from dielectric breakdown within the device wafer) is dependent on the thickness of both the device substrate and the insulating layer, because both determine a maximum strength of an electric field that can be sustained across the power device. For power devices formed on SOI, increasing a thickness of the insulating layer can increase the breakdown voltage, but may also have unintended effects such as increasing defect densities within the power device, which can degrade device performance. Therefore, although it is possible to increase the thickness of the insulating layer to increase the breakdown voltage for HV MOSFETs, a HV MOFSET made via such a technique may suffer some drawbacks.

Accordingly, the present disclosure provides techniques to increase breakdown voltages of HV MOSFETs on SOI without increasing the thickness of the insulating layer. It will be appreciated, however, that these techniques are not limited to SOI substrates, but are applicable to any type of substrate, such as bulk silicon substrates, sapphire substrates, binary semiconductor substrates, tertiary semiconductor substrates, or other substrates. In particular, the present disclosure relates to HV MOSFETs which include a lateral drain extension region disposed between a drain region and channel region of the device. Majority carriers "drift" through this lateral drain extension region and, thus, the lateral drain extension region allows the device, in general, to withstand larger voltages between source and drain during normal operation. Notably, a breakdown voltage enhancing region, which has a conductivity type that is opposite to that of the lateral drain extension region, is disposed under the lateral drain extension region and serves to enhance the breakdown voltage of the HV MOSFET. This breakdown voltage enhancing region blocks majority carriers from passing through it when they are moving between channel region and drain region, and thus, tends to push the carriers closer to the upper surface of the device substrate. In SOI substrates, for example, this increased distance between these carriers and the handle substrate increases the breakdown voltage of the device. In addition, because the breakdown voltage enhancing region can be formed through ion implantation, it represents a straightforward and relatively inexpensive approach for increasing breakdown voltage and is applicable to a large class of process technologies.

FIG. 1 illustrates a cross-sectional view of a portion of an integrated circuit 100 which includes a HV MOSFET in accordance with some embodiments. The HV MOSFET is formed on a substrate 102, which includes a device region 108. In the illustrated embodiment, the substrate is a silicon-on-insulator (SOI) substrate 102, which is made up of a handle substrate region 104, an insulating region 106 disposed over the handle substrate region 104, and a high-quality device region 108 disposed over the insulating region. However, it will be appreciated that the handle substrate region 104 and insulating region 106 are optional, and in other embodiments the device region 108 can be a stand-alone bulk substrate such as a bulk silicon substrate, sapphire substrate, binary semiconductor substrate, or ternary semiconductor substrate, for example. In many instances, the handle substrate region 104 can be a silicon layer of sufficient thickness to provide structural rigidity for the IC, and can for example, have a thickness of greater than 300 μm. In the illustrated embodiment, the handle substrate region 104 is illustrated as being p-type, but it can alternatively be n-type or intrinsic in other implementations. The insulating region 106 can be made of silicon dioxide for example, and can have a thickness ranging from hundreds of angstroms to several microns. The high-quality device region 108 can be an epitaxially-grown layer of silicon and can be p-type, n-type, or intrinsic; and can have a thickness ranging from a few microns up to several hundred microns.

A source region 110 and a drain region 112, which have a first conductivity type, are disposed in an upper portion of the device region 108 and are spaced apart from one another. The drain region 112 is disposed in a deep well region 113, which has the first conductivity type. A conductive gate electrode 114, such as a doped polysilicon gate electrode, is disposed over the upper portion of the silicon region 108 and is arranged between the source and drain regions 110, 112. A body region 116, which can surround the source region 110 and which has a second conductivity type opposite the first conductivity type, is arranged under the gate electrode 114 and within the silicon region 108. A lateral drain extension region 118, which has the first conductivity type, is disposed in the upper portion of the silicon region 108 and separates the body region 116 from the drain region 112. A conductive field plate 120, which can be continuous with the conductive gate electrode 114, can extend over the lateral drain extension region 118 and be separated therefrom by a field oxide 122. The field oxide 122 can have a field oxide thickness that is greater than a gate dielectric thickness of a gate dielectric 124, such as a silicon dioxide gate dielectric, which separates the gate electrode 114 from a channel region 126 within the body region 116.

During normal operation, bias circuitry (not shown) is adapted to apply a large positive gate-source voltage ($V_{GS}$) between the gate electrode 114 and source region 110, and at the same time apply a large positive drain-source voltage ($V_{DS}$) between the drain region 112 and source region 110. For example, the gate electrode 114 can be held at approximately +10 volts (V), while the source region 110 is held at approximately 0V, and the drain region 112 is held at approximately +5 V. Application of this $V_{GS}$ bias can cause inversion, whereby a conductive channel of negatively charged electrons accumulate in the channel region 126, and the concurrently applied $V_{DS}$ bias sweeps these electrons from the source region 110 to the drain region 112. In contrast, when $V_{GS}$ is less than a threshold voltage of the HV MOSFET, inversion does not occur, and the channel region 126 remains in a high resistance state, thereby providing isolation between source and drain regions 110, 112. The field plate 120 tends to smooth electrical field lines in the lateral drain extension region 118, helping to limit hot carrier effects.

In some circumstances, a large and undesired bias can be applied to the device. For example, electrostatic discharge (ESD) events, latch-up conditions, or other conditions can arise, and potentially damage the HV MOSFET. In particular, if a sufficiently large bias is applied to the source region 110 and gate electrode 114 while the drain region 112 and handle substrate region 104 are grounded, a large surge of power can run through the HV MOSFET, sometimes with catastrophic results that render the HV MOSFET inoperable. Engineers often refer to the voltage at which a device fails in this manner as the "breakdown voltage" of the device. To help increase a breakdown-voltage of the illustrated HV MOSFET, a breakdown voltage enhancing region 128, which has the second conductivity type, is disposed in a lower portion of the silicon region 108 under the lateral drain extension region 118. In the illustrated embodiment, the body region 116 is coupled to the source region 110 through a body contact 130 and a source contact 132, which can be butted together or shorted through a metal line 134. The breakdown voltage enhancing region 128 is coupled to the body region 116 as both have the second conductive type. P-n junction 129, which is formed at the interface of lateral drain extension region 118 and breakdown voltage enhancing region 128, tends to keep the carriers in lateral drain extension region 118, thereby providing a large distance between the carriers and the handle substrate region 104 to increase the breakdown voltage of the HV MOSFET.

In the embodiment of FIG. 1, the lateral drain extension region 118 has a first length $L_1$ as measured along a plane between the source region 110 and drain region 112. Further, the breakdown voltage enhancing region 128 has a second length $L_2$ as measured along the plane, wherein the first and second lengths $L_1$, $L_2$ are equal. Longer lengths $L_1$, $L_2$ generally correspond to higher voltage operation for the HV MOSFET and shorter lengths $L_1$, $L_2$ generally correspond to lower voltage operation for the HV MOSFET, with other device features being equal. Further in some embodiments where the silicon region 108 has a total thickness ranging from 1.5 μm and 19 μm, the lateral drain extension 118 can have a first depth, $D_1$, ranging between 0.5 μm and 9 μm, while the breakdown voltage enhancing region 128 has a second depth, $D_2$ ranging between 1 μm and 10 μm. In some embodiments, $D_1$ and $D_2$ can entirely span silicon region 108, such that upper surface of 118 is at the top of silicon region 108 and lower surface of 128 is at bottom of silicon region 108 and abuts top surface of insulating region 106.

As shown in FIG. 1 (as well as the other embodiments), the letter "N" refers to an n-type dopant, which may behave as an electron donor, and the letter "P" refers to a p-type dopant, which may behave as an electron acceptor. A plus sign "+" or a minus sign "−" is used to represent, respectively, a relative high or relative low concentration of the dopant. For example, an N++ region has a greater concentration of n-type dopants than an N+ region, which has a greater concentration of n-type dopants than an N region, which has a greater concentration of n-type dopants than an N− region. Although embodiments and figures may be discussed, for example, in the context of an n-channel device (where the majority carriers in the channel region are electrons, which are negatively charged and can be represented by a lowercase n–); the embodiments and figures can be mapped to a p-type device by substituting n-type dopant and materials for corresponding p-type dopant and materials, and vice versa. In some embodiments, the source/drain regions 110, 112 can have a doping concentration of approximately $5E13\sim1E16/cm^2$; the body region 116 can have a doping concentration ranging from approximately $5E11\sim1E13/cm^2$; the lateral drain extension region 118 and breakdown voltage enhancing region 128 each have a doping concentration of approximately $5E11\sim1E13/cm^2$; and the drain well region 113 has a doping concentration of approximately $1E12\sim5E13/cm^2$.

Figure 2:
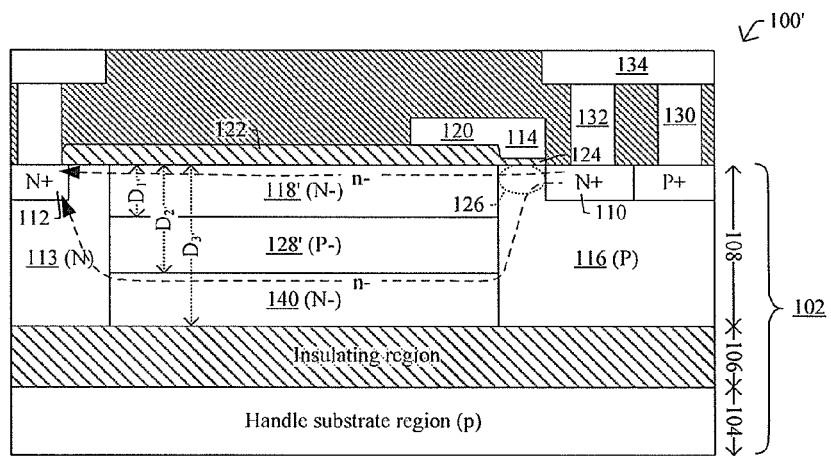
FIG. 2 illustrates a cross-sectional view of another n-type HV MOSFET that includes a breakdown voltage enhancing region in accordance with some embodiments.

FIG. 2 shows another embodiment of an n-type HV MOSFET device which further includes an additional lateral drain extension region 140 arranged under the breakdown voltage enhancing region 128'. The additional lateral drain extension region 140 has the first conductivity type and is disposed in a lower portion of the silicon region 108. The insertion of the additional lateral drain extension region 140 may be beneficial in that it can provide another current path between source region 110 and drain region 112 and, in this regard, may help alleviate current crowding near the drain region 112. By alleviating current crowding, this additional lateral drain extension region 140 may help limit some failure modes such as burnout.

Figure 3:
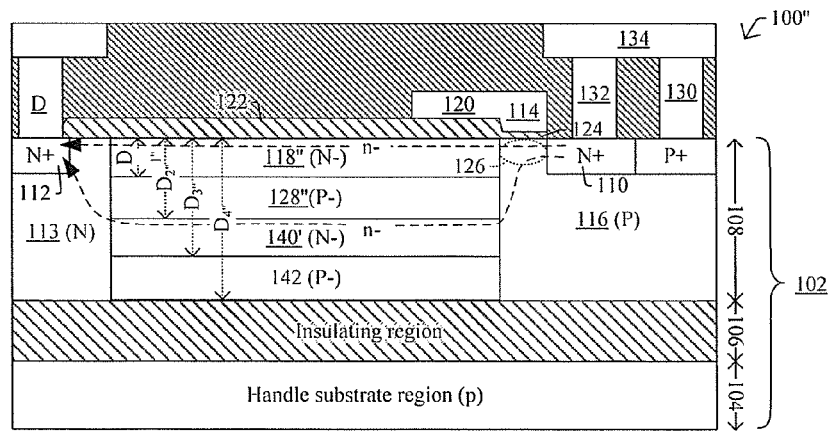
FIG. 3 illustrates a cross-sectional view of still another n-type HV MOSFET that includes a breakdown voltage enhancing region in accordance with some embodiments.

FIG. 3 shows another embodiment of an n-type HV MOSFET device 100" which further includes an additional breakdown voltage enhancing region 142 arranged under the additional lateral drain extension region 140'. The additional breakdown voltage enhancing region 142 has the second conductivity type and is disposed in a lower portion of the silicon region 108. An uppermost portion of the lateral drain extension region 118" corresponds to an upper surface of the silicon region 108, and a lowermost portion of the additional breakdown voltage enhancing region 142 corresponds to a lower surface of the silicon region and abuts an upper surface of the insulating region 106 of the SOI substrate. The insertion of the additional breakdown voltage enhancing region 142 may be beneficial in that it can push carriers upwards into the device substrate 108, and thus away from the handle substrate region 104 to increase the breakdown voltage of the HV MOSFET 100". Additionally, in FIG. 3's embodiments, the regions 118", 128", 140', and 142 can each have equal lengths which eases manufacturing of such devices as each of these regions can then be implanted through a single mask.

Figure 4:
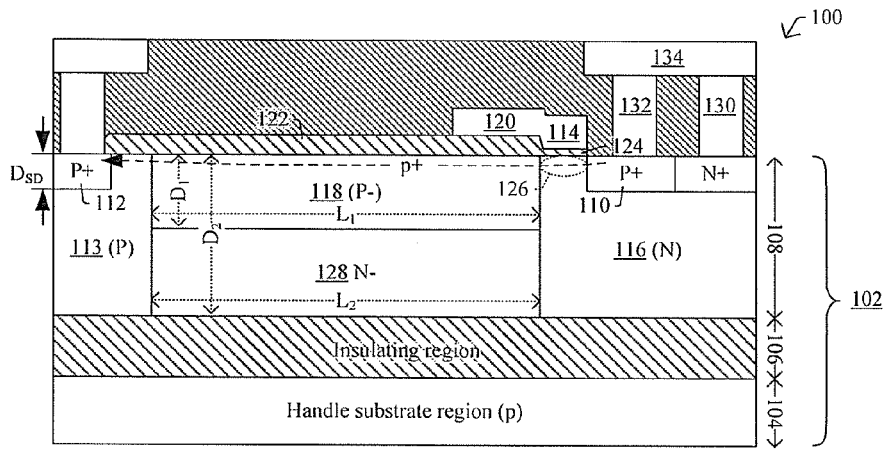
FIG. 4 illustrates a cross-sectional view of a p-type HV MOSFET in accordance with some embodiments.
Figure 5:
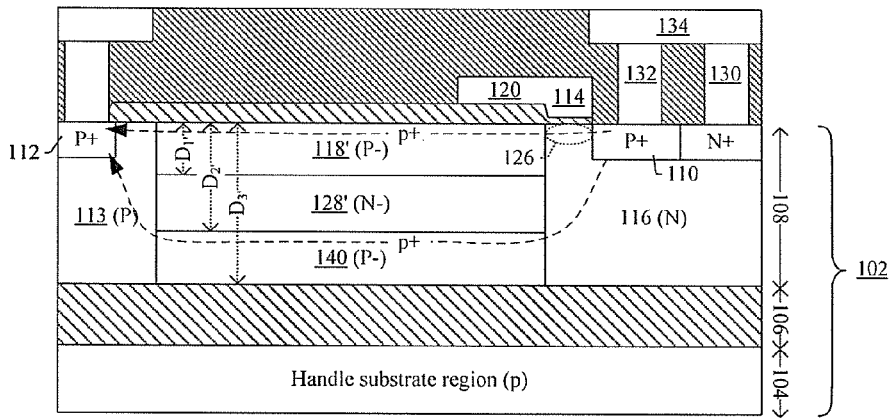
FIG. 5 illustrates a cross-sectional view of another p-type HV MOSFET that includes a breakdown voltage enhancing region in accordance with some embodiments.
Figure 6:
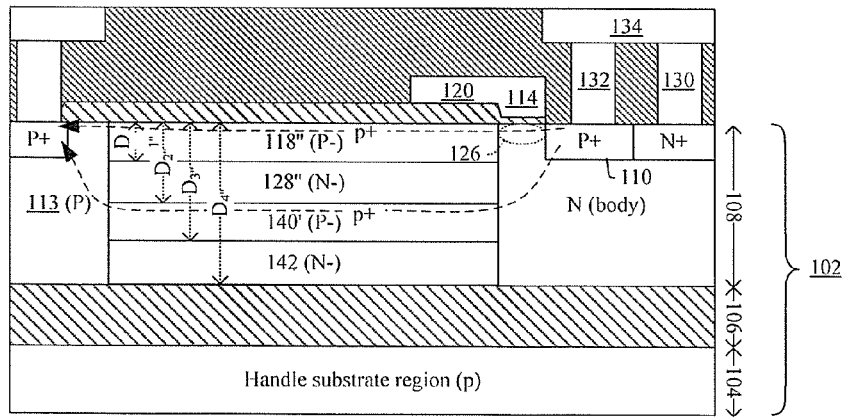
FIG. 6 illustrates a cross-sectional view of still another p-type HV MOSFET that includes a breakdown voltage enhancing region in accordance with some embodiments.

FIGS. 4-6 show embodiments that generally correspond to FIGS. 1-3, respectively, but in FIGS. 4-6 the n-type regions and p-type regions are "flipped" relative to FIGS. 1-3. The result is that FIGS. 4-6 show p-type HV MOSFET devices, whereas FIGS. 1-3 showed n-type HV MOSFET devices. Thus, the embodiments of FIGS. 4-6 use n-type breakdown voltage enhancing regions under p-type lateral drain extension regions.

Figure 7:
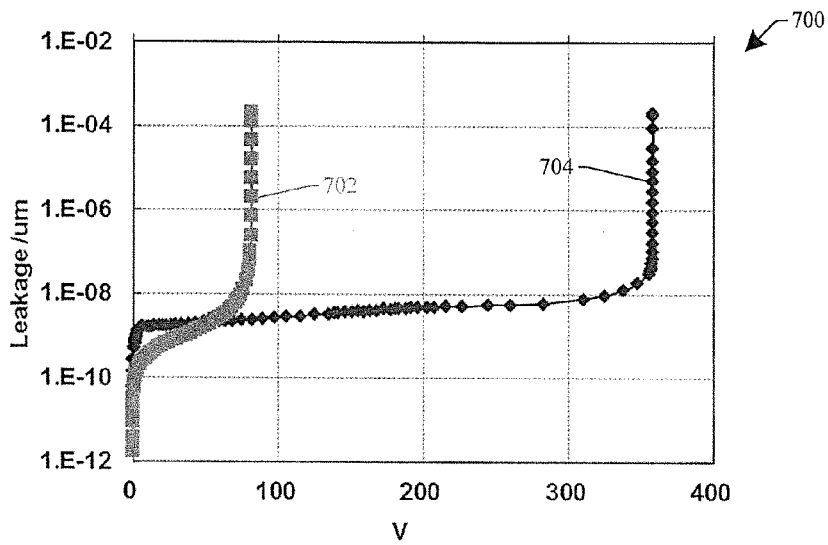
FIG. 7 illustrates a chart depicting current leakage under various voltage bias conditions to highlight an example of improved breakdown voltage characteristics for HV MOSFETs in accordance with some embodiments.

FIG. 7 illustrates a graph 700 of breakdown voltage as a function of device wafer thickness for a conventional HV MOSFET (curve 702) and a HV MOSFET in accordance with some embodiments of the present disclosure (curve 704). The x-axis of graph 700 represents a voltage applied to the source and gate of a HV MOSFET on SOI while the drain and handle substrate of the HV MOSFET are held at zero volts. The y-axis of graph 700 illustrates the leakage current induced under such bias conditions. As can be seen from the first curve 702, the conventional device is able to reliably withstand the applied voltage up to approximately 80V or so, at which point the leakage current suddenly spikes. Thus, the conventional HV MOSFET device represented by curve 702 experiences voltage breakdown at approximately 80 volts. In comparison, as can be seen by the second curve 704, a HV MOSFET in accordance with some embodiments is able to withstand a positive voltage having a magnitude of greater than 300 V being applied to the source region and gate while drain and handle wafer are grounded without the HV MOSFET experiencing device failure through voltage breakdown.

Figure 8:
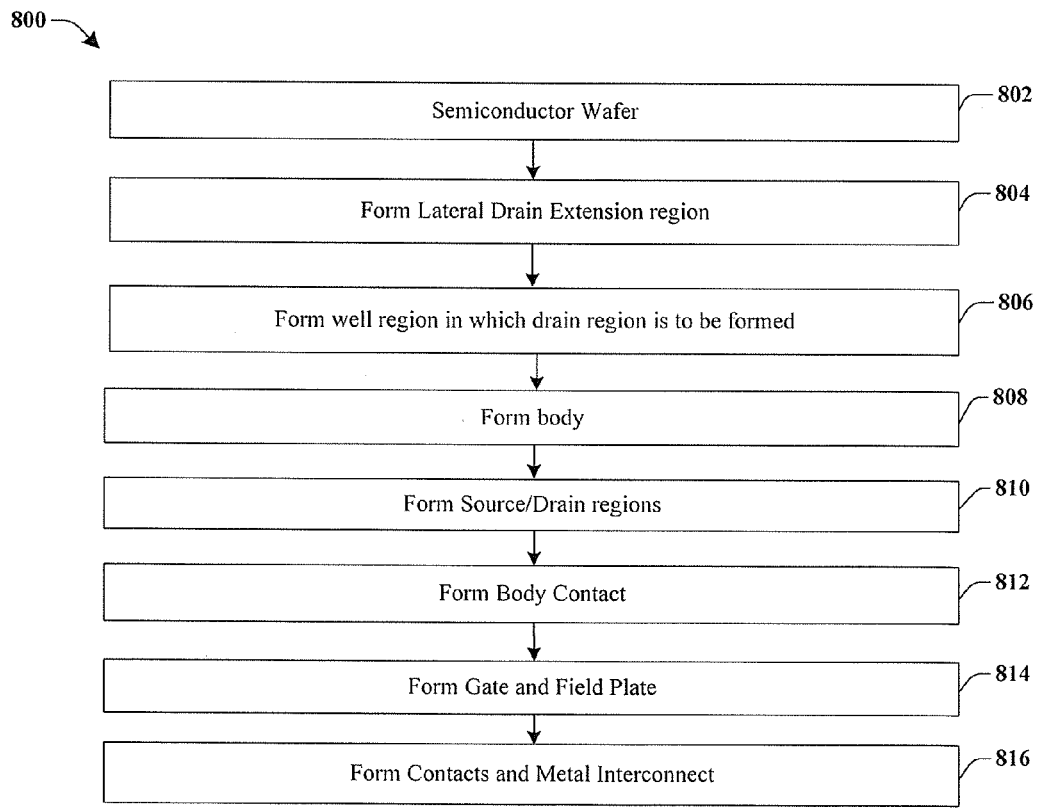
FIG. 8 illustrates a flowchart for a method of manufacturing a HV MOSFET in accordance with some embodiments.

FIG. 8 illustrates a flow chart of some embodiments of a method 800 a method of power device fabrication. While the method 800 has been illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. The same is true with the subsequently described cross-sections described with regards to FIGS. 9-18, where the order in which doping processes and other processes are carried out can be changed from what is illustrated.

At 802 a semiconductor wafer is provided. In some embodiments, the wafer is an SOI wafer is made up of a device wafer, a handle wafer, and an intermediate oxide layer bonding the device wafer to the handle wafer. The device wafer has a first conductivity type, and is made of semiconductor material, such as silicon for example. Depending on the implementation, the SOI wafer can have a diameter of four inches, six inches, twelve inches, 200 mm, 300 mm, 400 mm, 450 mm, or other diameters, for example.

At 804 a lateral drain extension region is formed by selectively implanting ions of a second conductivity type into the device wafer. The implantation process leaves a breakdown voltage enhancing region, which retains the first conductivity type, underneath the lateral drain extension region.

At 806 a well having the second conductivity type is formed alongside one end of the lateral drain extension region. This well is typically formed by selectively implanting ions into the device wafer of the SOI wafer.

At 808 a body region is formed by selectively implanting ions of the first conductivity type into the device wafer of the SOI wafer. Relative to the well, the body region is formed on an opposite end of the lateral drain extension region.

At 810 source/drain regions, which have the second conductivity type, are formed by selectively implanting ions into the device wafer of the SOI wafer. The source region is formed in the body region and is spaced apart from the lateral drain extension region by at least a portion of the body, while the drain region is formed in the well.

At 812 a body contact is formed by selectively implanting ions of the first conductivity type into the body region.

At 814 a gate and field plate are formed by forming a conductive layer over the SOI wafer, and patterning the conductive layer to provide a gate electrode over the body region and a field plate over the lateral drain extension region.

At 816 contacts and metal interconnect are formed to ohmically couple to the source/drain regions, and body contact region.

FIGS. 9-18 illustrate a series of cross-sectional views that collectively depict a method of manufacture for a HV MOSFET in accordance with some embodiments. These cross-sectional views are simplified in some regards for clarity, for example masks are showed in simplified form and anneals and other steps are omitted.

Figure 9:
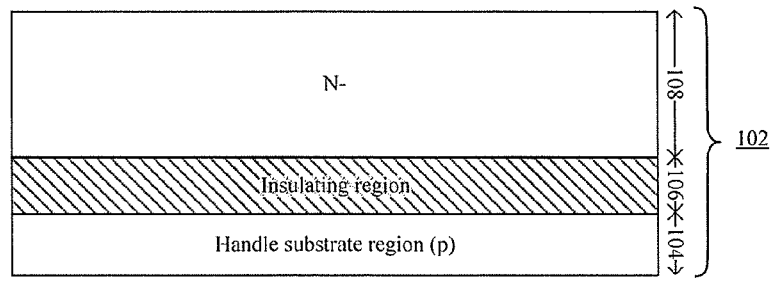
FIGS. 9-18 illustrate a series of cross-sectional views that collectively depict an example method of manufacturing a HV MOSFET in accordance with some embodiments.

FIG. 9, which corresponds to one example of block 802 of FIG. 8, illustrates a SOI wafer 102. The SOI wafer 102 includes a handle wafer 104, such as a bulk silicon wafer, and a high quality device layer 108, which is typically an epitaxially grown silicon layer. An insulating layer 106 is arranged between the handle wafer 104 and device layer 108, and often comprises oxide or sapphire. For the embodiments of FIGS. 9-18, the device wafer 108 comprises a lightly-doped n-type material (e.g., N−), and the handle wafer 104 comprises a p-type material, but other conductivity types are also contemplated as falling within the scope of this disclosure. In other embodiments, other types of wafer, such as a bulk silicon wafer, sapphire wafer, binary semiconductor wafer (e.g., III-V semiconductor material), ternary semiconductor wafer, or higher order semiconductor wafer can be used.

Figure 10:
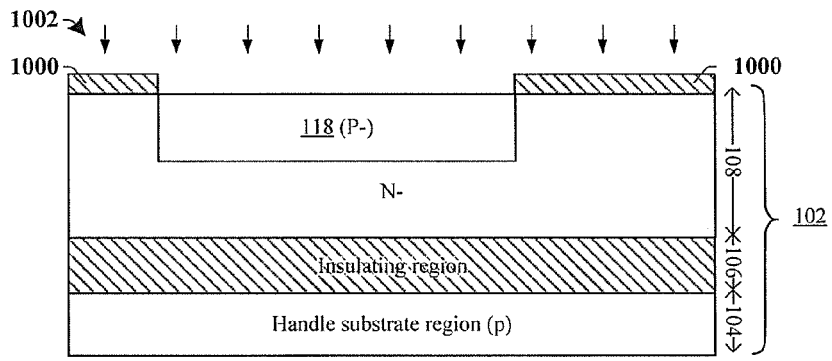

In FIG. 10, which corresponds to one example of block 804 of FIG. 8, a first mask 1000 is formed and patterned over the device layer 108, and a first implant 1002 is performed with the first mask 1000 in place to form a p-type well 118 in an upper surface region of the device layer 108. This p-well 118 may also be referred to as a lateral drain extension region. In the illustrated embodiment, the first mask 1000 blocks ions from reaching the substrate, such that ions are only implanted into the device layer 108 through the opening in the first mask 1000. The first mask may be include a patterned photoresist mask, a patterned hardmask, such as a nitride mask, a patterned field oxide (e.g., field oxide 122), or combinations of these materials and/or other materials. The same is true for other masks shown in this process flow. Further, alternatively, rather than using ion implantation to form p-type well 118 (as well as other doped regions described herein), a highly doped patterned layer can be formed over the p-type well region 118 and then heated to out-diffuse acceptor dopants (e.g., boron) and thereby form p-type well 118. In some embodiments, additional implants can be carried out with the first mask 1000 in place to form additional, deeper lateral drain extension regions (e.g., 140' illustrated in FIG. 6) underneath and spaced apart from the lateral drain extension region 118.

Figure 11:
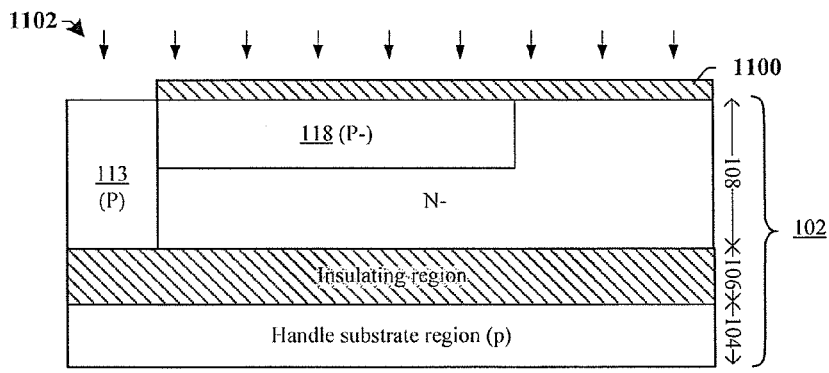

In FIG. 11, which corresponds to one example of block 806 of FIG. 8, a second mask 1100 is formed and patterned over the SOI wafer 102, and a second implant 1102 is performed with the second mask 1100 in place to form a p-type deep well region 113. The deep well region 113 is continuous with the p-well 118, and may extend through the entire thickness of the device layer 108.

Figure 12:
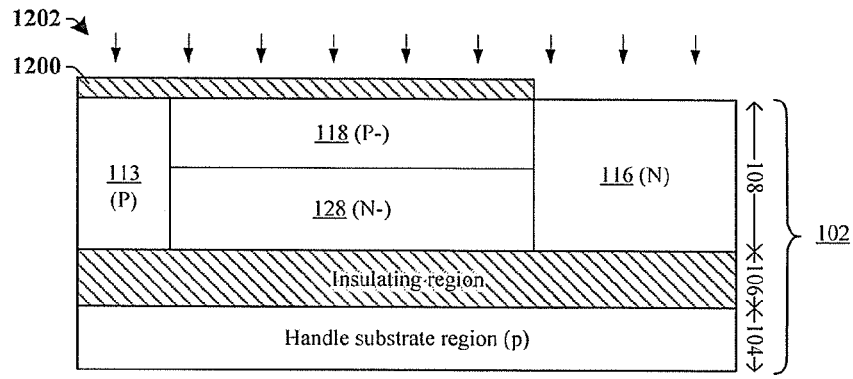

In FIG. 12, which corresponds to one example of block 808 of FIG. 8, a third mask 1200 is formed and patterned over the SOI wafer 102, and a third implant 1202 is performed with the third mask 1200 in place to form an n-type body region 116. The body region 116 may extend through the entire thickness of the device layer 108, and is continuous with one or more breakdown voltage enhancing regions 128. Typically, the body region 116 has a higher dopant concentration than the breakdown voltage enhancing region 128.

Figure 13:
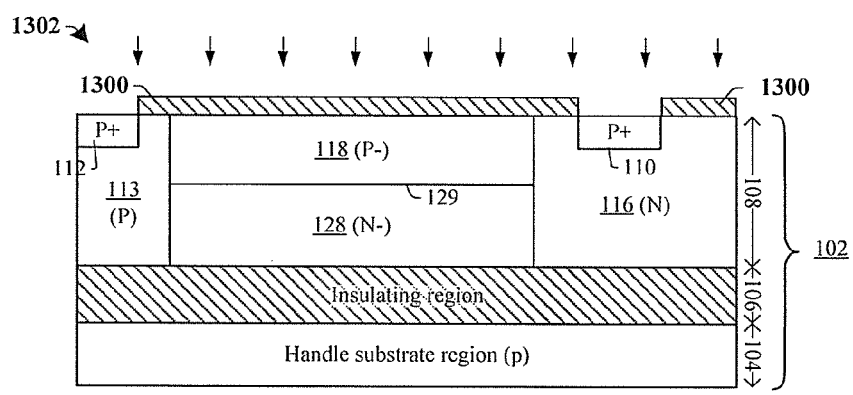

In FIG. 13, which corresponds to one example of block 810 of FIG. 8, a fourth mask 1300 is formed and patterned over the SOI wafer 102, and a fourth implant 1302 is performed with the fourth mask 1300 in place to form heavily doped p-type source/drain regions 110, 112. The drain region 112 is coupled to the deep well 113, and is coupled to the lateral drain extension region 118 through the deep well 113. Typically, the source/drain regions 110, 112 have a higher dopant concentration than the deep well 113 and lateral drain extension region 118.

Figure 14:
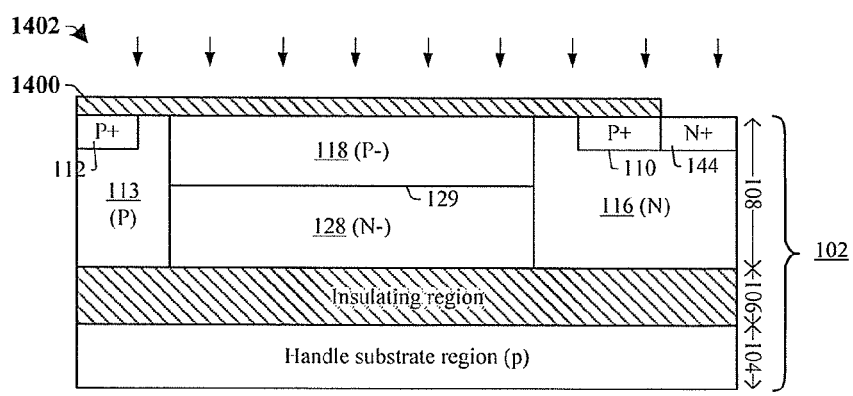

In FIG. 14, which corresponds to one example of block 812 of FIG. 8, a fifth mask 1400 is formed and patterned over the SOI wafer 102, and a fourth implant 1402 is performed with the fifth mask 1400 in place to form a heavily doped n-type body contact region 144. The body contact region 144 is continuous with the body region 116, and coupled to the breakdown voltage enhancing region 128 through the body region 116. Typically, the body contact region 144 has a higher dopant concentration than the body region 116.

Figure 15:
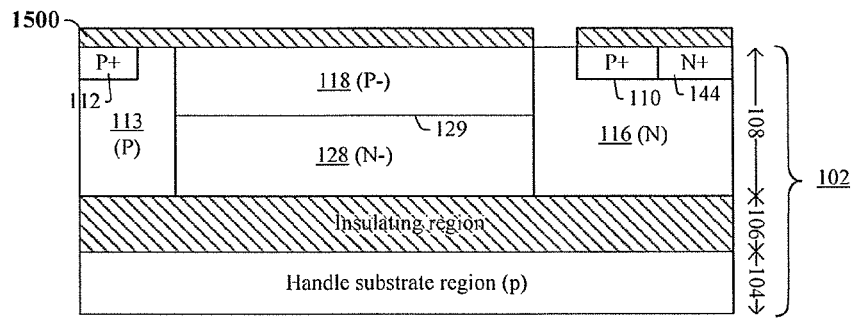

In FIG. 15, a sixth mask 1500 is formed and patterned over the SOI wafer 102, and an etch is carried out to expose a portion of the body region 116 adjacent the source region 110.

Figure 16:
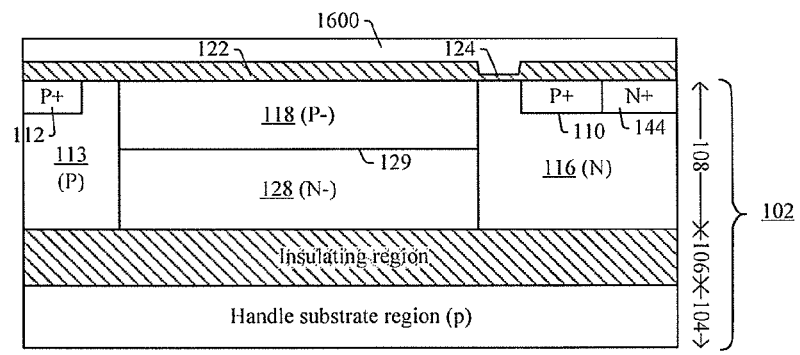

In FIG. 16 a gate dielectric 124 is disposed over the exposed body region 116, and subsequently, a conductive gate material 1600 (e.g., polysilicon) is disposed over the gate dielectric 124 and over a field dielectric layer 122. It will be appreciated that in other embodiments, the gate dielectric 124 can be formed earlier in the process, and ions can be implanted through the gate dielectric 124 to form the various wells and other doped regions in device layer 108. The gate dielectric 124 can comprise silicon dioxide, a low-κ dielectric, or an extreme low-κ dielectric.

Figure 17:
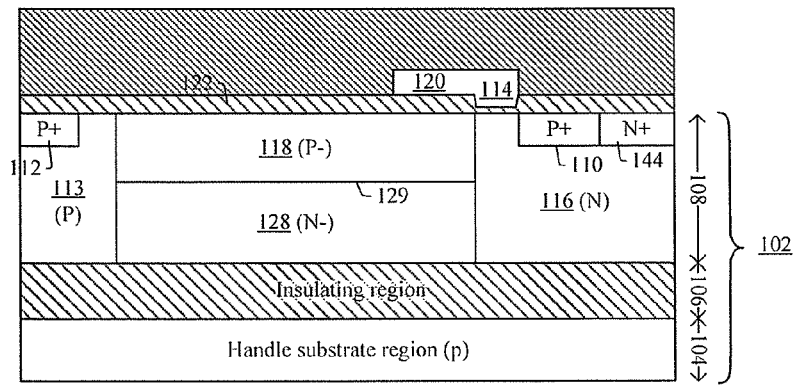

As shown in FIG. 17, which corresponds to one example of block 814 of FIG. 8, the gate material 1600 is then patterned using a seventh mask (not shown) to fashion a gate electrode 114 and a field plate 120. In particular, a first portion of the gate material 1600 arranged over the gate dielectric 124 forms the gate electrode 114, and a second portion of the gate material 1600 disposed over the field dielectric layer 122 forms a field plate 120, which is electrically-isolated from the device wafer by the field oxide 122.

Figure 18:
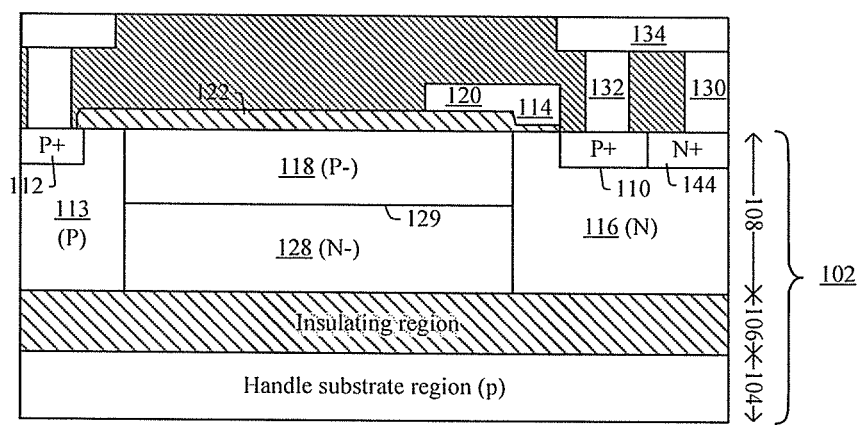

In FIG. 18, which corresponds to one example of block 816 of FIG. 8, contacts (130, 132) and metallization layer 134 are formed over the structure to provide electrical connections to the terminals of the device. In some embodiments, the contacts can be tungsten, nickel, aluminum, or copper, but other conductive materials can also be used. Further, although not shown, a silicide is also typically present on uppermost surface regions of the source/drains regions 110, 112 and body contact region 144 to help provide an ohmic coupling between the contacts, e.g., 132, 134 and underlying device structures within device layer 108. The metallization layer is often copper, but can also be aluminum or another conductive material.

Therefore, the present disclosure relates to a method to increase breakdown voltage of a power device. In some embodiments, an integrated circuit (IC) includes a substrate including a device region. A source region and a drain region, which have a first conductivity type, are disposed in the device region and spaced apart from one another. A gate electrode is disposed over an upper region of the device region and is arranged between the source and drain regions. A body region, which has a second conductivity type opposite the first conductivity type, is arranged under the gate electrode in the device region and separates the source and drain regions. A lateral drain extension region, which has the first conductivity type, is disposed in the upper region of the device region and extends laterally between the body region and the drain region. A breakdown voltage enhancing region, which has the second conductivity type, is disposed in the device region and is arranged under the lateral drain extension region.

Some embodiments relate to a method. In this method, a semiconductor wafer which includes a device region is provided. The device region has a first conductivity type. A lateral drain extension region, which has a second conductivity type, is formed in an upper region of the device region while a lower region of the device region, which corresponds to a breakdown voltage enhancing region, remains at the first conductivity type. Source and drain regions, which have the second conductivity type, are formed on opposite sides of the lateral drain extension region in the device region. The source region is spaced apart from a nearest edge of the lateral drain extension region by a channel region having the first conductivity type. A gate dielectric is formed over the channel region, and a conductive gate material layer is formed over the gate dielectric.

Still other embodiments relate to an integrated circuit (IC) that includes a silicon-on-insulator (SOI) substrate made up of a handle substrate region, an insulating region disposed over the handle substrate region, and a silicon region disposed over the insulating region. A source region and a drain region, which have a first conductivity type, are disposed in an upper region of the silicon region and are spaced apart from one another. A gate electrode is disposed over the upper region of the silicon region and is arranged between the source and drain regions. A body region, which has a second conductivity type opposite the first conductivity type, is arranged under the gate electrode in the silicon region and separates the source and drain regions. A lateral drain extension region, which has the first conductivity type, is disposed in the upper region of the silicon region and extends laterally between the body and drain regions. A breakdown voltage enhancing region, which has the second conductivity type, is disposed in the silicon region and is arranged under the lateral drain extension region. An upper portion of the breakdown voltage enhancing region meets a lower portion of the lateral drain extension region at a pn junction. An additional lateral drain extension region, which has the first conductivity type, disposed in the silicon region and under the breakdown voltage enhancing region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a substrate including a device region;
   a source region and a drain region, which have a first conductivity type, disposed in the device region and spaced apart from one another;
   a gate electrode disposed over an upper region of the device region and arranged between the source and drain regions;
   a body region, which has a second conductivity type opposite the first conductivity type, arranged under the gate electrode in the device region and separating the source and drain regions;
   a lateral drain extension region, which has the first conductivity type, disposed in the upper region of the device region and extending laterally between the body and drain regions;
   a breakdown voltage enhancing region, which has the second conductivity type, disposed in the device region and arranged under the lateral drain extension region; and
   an additional lateral drain extension region, which has the first conductivity type, disposed in the device region and under the breakdown voltage enhancing region.

2. The IC of claim 1, wherein an upper portion of the breakdown voltage enhancing region meets a lower portion of the lateral drain extension region at a pn junction.

3. The IC of claim 2, wherein the substrate is a silicon-on-insulator (SOI) substrate comprising:
   a handle substrate region;
   an insulating region disposed over the handle substrate region, and
   a silicon region over the insulating region, wherein the silicon region corresponds to the device region and has a lower surface abutting an upper surface of the insulating region.

4. The IC of claim 1, wherein the lateral drain extension region has a first length as measured along a plane between the source and drain regions, and wherein the breakdown voltage enhancing region has a second length as measured along the plane, the first and second lengths being equal.

5. The IC of claim 3, further comprising:
   an additional breakdown voltage enhancing region, which has the second conductivity type, disposed in the device region and under the additional lateral drain extension region.

6. The IC of claim 5, wherein the additional breakdown voltage enhancing region and the additional lateral drain extension region have respective lengths that are equal to one another and equal to respective lengths of the lateral drain extension region and the breakdown voltage enhancing region.

7. The IC of claim 6, wherein an uppermost portion of the lateral drain extension region corresponds to an upper surface of the silicon region, and a lowermost portion of the additional breakdown voltage enhancing region corresponds to a lower surface of the silicon region and abuts an upper surface of the insulating region of the SOI substrate.

8. The IC of claim 1, wherein the breakdown voltage enhancing region is operably coupled to the body region.

9. The IC of claim 8, wherein the body region and the breakdown voltage enhancing region are each coupled to the source region through a body contact that is shorted to a source contact.

10. The IC of claim 1, wherein the drain region is disposed in a well, which has the first conductivity type, surrounding the drain region and extending continuously downward from the upper region of the device region to a bottom region of the breakdown voltage enhancing region.

11. The IC of claim 1, further comprising:
    a field plate arranged at least partially over a portion of the lateral drain extension nearest the gate electrode and overlying a field oxide having a field oxide thickness that is greater than a gate dielectric thickness for a gate dielectric separating the gate electrode from the device region.

12. The IC of claim 3, wherein a HV MOSFET corresponding to the source and drain regions is structured to withstand a positive voltage having a magnitude of greater than 300 V applied to the source region and the gate electrode while the drain region and the handle substrate region are grounded without the HV MOSFET experiencing device failure through voltage breakdown.

13. A method, comprising:
    providing a wafer including a device region having a first conductivity type;
    forming a lateral drain extension region, which has a second conductivity type, in an upper region of the device region while leaving a lower region of the device region corresponding to a breakdown voltage enhancing region, which remains at the first conductivity type;

forming source and drain regions, which have the second conductivity type, on opposite sides of the lateral drain extension region in the wafer, wherein the source region is spaced apart from a nearest edge of the lateral drain extension region by a channel region having the first conductivity type; and forming a gate dielectric over the channel region and forming a conductive gate material layer over the gate dielectric;

forming an additional lateral drain extension region underneath the breakdown voltage enhancing region and spaced apart from the lateral drain extension region by the voltage enhancing region, wherein the additional lateral drain extension region has the second conductivity type.

14. The method of claim 13, further comprising:

patterning the conductive gate material to form a gate electrode over the channel region and to concurrently form a field plate over the lateral drain extension region, wherein the field plate is continuous with the gate electrode.

15. The method of claim 13, further comprising:

forming a body contact region, which has the first conductivity type, in the upper region of a body region to which the channel region is ohmically coupled, wherein the body region and body contact region are operably coupled to the breakdown voltage enhancing region.

16. The method of claim 13, wherein the lateral drain extension region and the additional lateral drain extension region are formed using the same mask.

17. An integrated circuit (IC) comprising:

a silicon-on-insulator (SOI) substrate including a handle substrate region, an insulating region disposed over the handle substrate region, and a silicon region disposed over the insulating region;

a source region and a drain region, which have a first conductivity type, disposed in an upper region of the silicon region and spaced apart from one another;

a gate electrode disposed over the upper region of the silicon region and arranged between the source and drain regions;

a body region, which has a second conductivity type opposite the first conductivity type, arranged under the gate electrode in the silicon region and separating the source and drain regions;

a lateral drain extension region, which has the first conductivity type, disposed in the upper region of the silicon region and extending laterally between the body and drain regions;

a breakdown voltage enhancing region, which has the second conductivity type, disposed in the silicon region and arranged under the lateral drain extension region, wherein an upper portion of the breakdown voltage enhancing region meets a lower portion of the lateral drain extension region at a pn junction; and an additional lateral drain extension region, which has the first conductivity type, disposed in the silicon region and under the breakdown voltage enhancing region.

18. The IC of claim 1, wherein lateral drain extension region has outermost edges that are aligned with outermost edges of the breakdown voltage enhancing region.

19. The IC of claim 18, wherein aligned edges of the lateral drain extension region and breakdown voltage enhancing region which are nearest to the source region each directly contact a continuous vertical edge of the body region.

20. The IC of claim 18, wherein aligned edges of the lateral drain extension region and breakdown voltage enhancing region which are nearest to the drain region each directly contact a continuous vertical edge of a drain well region which extends under the drain region and which is disposed between the drain region and the lateral drain extension region.

21. The IC of claim 5, wherein lateral drain extension region has outermost edges that are aligned with outermost edges of the breakdown voltage enhancing region, and wherein the outermost edges of the lateral drain extension region are also aligned with outermost edges of the additional breakdown voltage enhancing region.

* * * * *